United States Patent [19]

Kawashima et al.

[11] Patent Number: 4,812,680
[45] Date of Patent: Mar. 14, 1989

[54] HIGH VOLTAGE DETECTING CIRCUIT

[75] Inventors: Hiromi Kawashima; Atsushi Takeuchi, both of Kawasaki, Japan

[73] Assignee: Fujitsu Limited, Kawasaki, Japan

[21] Appl. No.: 27,936

[22] Filed: Mar. 19, 1987

[30] Foreign Application Priority Data

Mar. 19, 1986 [JP] Japan ................. 61-059468

[51] Int. Cl.[4] .................. H03K 5/153; H03K 5/24
[52] U.S. Cl. ............................ 307/350; 307/354; 307/362
[58] Field of Search ............... 307/350, 354, 362, 363, 307/296 R

[56] References Cited

U.S. PATENT DOCUMENTS 4,024,415  5/1977  Matsuura .
4,301,380 11/1981  Thomas .
4,321,489  3/1982  Higuchi et al. .
4,626,704 12/1986  Takata et al. ................. 307/350
4,658,156  4/1987  Hashimoto .

FOREIGN PATENT DOCUMENTS 0093606 11/1983  European Pat. Off. .
2930424  3/1981  Fed. Rep. of Germany .
60-124124  7/1985  Japan .

OTHER PUBLICATIONS

European Search Report, The Hague, 03-25-88.

*Primary Examiner*—John Zazworsky
*Attorney, Agent, or Firm*—Staas & Halsey

[57]  ABSTRACT

A high voltage detecting circuit included in a semiconductor device having terminals for generating a control signal in order to start a specific mode of the semiconductor device when a potential of a specific mode signal higher by a predetermined value than a normal input voltage having a predetermined range is applied to at least one of the terminals of the semiconductor device. The high voltage detecting circuit comprises a level shift means having an input end and an output end and connected between a blocking transistor and a discrimination circuit for obtaining a potential of the output end lower by a level shift valve than a potential of the input end. Consequently, the high voltage detecing circuit will not generate an error control signal even if the semiconductor device is switched ON and a power line potential of the device is gradually increased while a normal mode signal of the normal input voltage is continuously applied to the terminal of the semiconductor device.

3 Claims, 7 Drawing Sheets

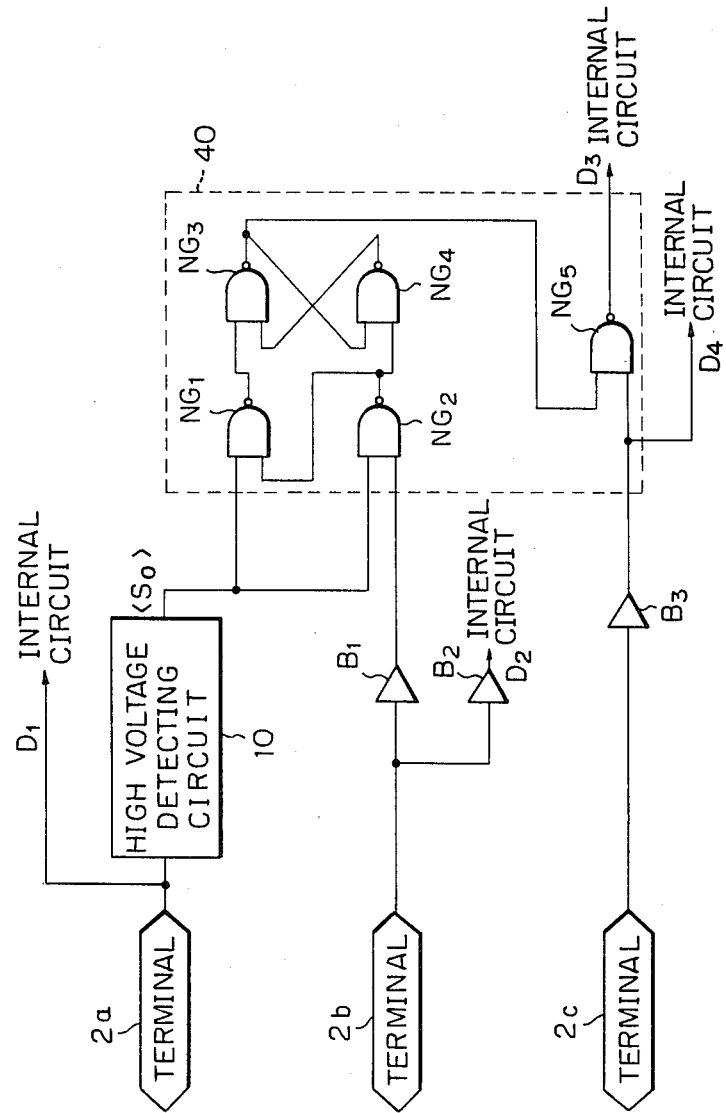

HIGH VOLTAGE DETECTING CIRCUIT

BACKGROUND OF THE INVENTION

1. Field of the Invention

The present invention relates to a high voltage detecting circuit, in particular, to a high voltage detecting circuit included in a semiconductor device having terminals, for generating a control signal in order to start a specific mode of the semiconductor device, when a potential of a specific mode signal higher by a predetermined value then a normal input voltage having a predetermined range, is applied to at least one of the terminals of the semiconductor device.

2. Description of the Related Art

In general, a high voltage detecting circuit is included in a semiconductor device for detecting a potential of a terminal of the semiconductor device. When the potential of the terminal of the device is higher by a predetermined value than a normal input voltage having a predetermined range, the high voltage detecting circuit generates a control signal for starting a specific mode of the semiconductor device. Upon receiving the control signal, the semiconductor device changes to the specific mode, e.g., a testing mode. A similar high voltage detecting circuit is disclosed in, for example, Unexamined Japanese Patent Publication (Kokai) No. 60-124124.

When a potential of a power line (hereinafter referred to as a power line potential) of the semiconductor device is stabilized, the prior high voltage detecting circuit, as in Unexamined Japanese Patent Publication No. 60-124124, generates or does not generate the control signal exactly in accordance with the potential applied from an another device to the terminal of the semiconductor device. That is, when the potential of the terminal of the semiconductor device is within the predetermined range of the normal input voltage, the prior high voltage detecting circuit does not generate the control signal for starting the specific mode of the device. When the potential of the terminal of the semiconductor device is higher by the predetermined value than the normal input voltage, the prior high voltage detecting circuit generates the control signal and the semiconductor device changes to the specific mode, e.g., the testing mode.

When, however, the power line potential of the semiconductor device is not stabilized, for example, the semiconductor device is switched ON and the power line potential of the device gradually increased, while the normal mode signal of the normal input voltage is continuously applied to the terminal of the semiconductor device, and thus the normal mode signal of the terminal of the semiconductor device may be higher by the predetermined value than the increased power line potential. That is, the normal signal of the normal input voltage is considered to be the control signal for starting the specific mode of the semiconductor device. Consequently, the prior high voltage detecting circuit may generate an error control signal without receiving the specific mode signal, and the semiconductor device may be changed to the specific mode by the error control signal.

SUMMARY OF THE INVENTION

It is an object of the present invention to provide a high voltage detecting circuit, which is included in a semiconductor device and precisely detects a potential of a terminal of the semiconductor device and does not generate an error control signal, even if the semiconductor device is switched ON and a power line potential of the device gradually increased while the potential of the terminal of the semiconductor device is within a normal input voltage having a predetermined range.

According to the present invention, there is provided a high voltage detecting circuit included in a semiconductor device having terminals, for generating a control signal in order to start a specific mode of the semiconductor device when a potential of a specific mode signal higher by a predetermined value than a normal input voltage having a predetermined range is applied to at least one of the terminals of the semiconductor device. The high voltage detecting circuit includes a first power supply means, a second power supply means, a blocking transistor, a level shift means, a resistor means, and discrimination circuit.

The first power supply means is used for a high potential and the second power supply means is used for a low potential. The blocking transistor has a control electrode and two other electrodes, the control electrode being operatively connected to at least one of the terminals of the semiconductor device, and one of two other electrodes being operatively connected to the first power supply means, for switching ON the blocking transistor when a potential of the control electrode is higher by a threshold voltage of the blocking transistor than a potential of the one of the two other electrodes. The level shift means has an input end and an output end, the input end being operatively connected to the other of the two other electrodes of the blocking transistor, for obtaining a potential of the output end lower by a level shift value than a potential of the input end.

The resistor means has a first end and a second end, the first end being operatively connected to the output end of the level shift means and the second end being operatively connected to the second power supply means, for keeping the potential of the first end to the low potential of the second power supply means when a potential of the at least one of the terminals of the semiconductor device is within the predetermined range of the normal input voltage. The discrimination circuit has a first end and a second end, the first end of the discrimination circuit being operatively connected to the output end of the level shift means and to the first end of the resistor means, for outputting the control signal to the second end of the discrimination circuit when a potential of the first end of the discrimination circuit is higher than a threshold voltage of the discrimination circuit.

The level shift means may include at least one MIS transistor, having a control electrode and two other electrodes. The control electrode is operatively connected to one of the two other electrodes. The other of the two other electrodes is operatively connected to the first end of the resistor means. The level shift value is determined by the threshold voltage of at least one MIS transistor.

The resistor means may include a depletion type MIS transistor, having a control electrode and two other electrodes. The control electrode is operatively connected to one of the two other electrodes and to the second power supply means. The other of the two other electrodes is operatively connected to the output end of the level shift means and to the first end of the discrimination circuit.

The high voltage detecting circuit may further include a leakage current cutting off transistor having a control electrode and two other electrodes. The control electrode is operatively connected to one of the two other electrodes and to one of two other electrodes of the blocking transistor. The other of the two other electrodes is operatively connected to at least one of the terminals of the semiconductor device, for keeping a leakage current under a predetermined standard current of the semiconductor device.

BRIEF DESCRIPTION OF THE DRAWINGS

The present invention will be more clearly understood from the description of the preferred embodiments as set forth below with reference to the accompanying drawings, wherein:

FIG. 4 is a block circuit diagram illustrating a latch circuit to which a high voltage detecting circuit is applied;

DESCRIPTION OF THE PREFERRED EMBODIMENTS

For a better understanding of the preferred embodiments, the problems in the related art will be first explained.

Figure 1:
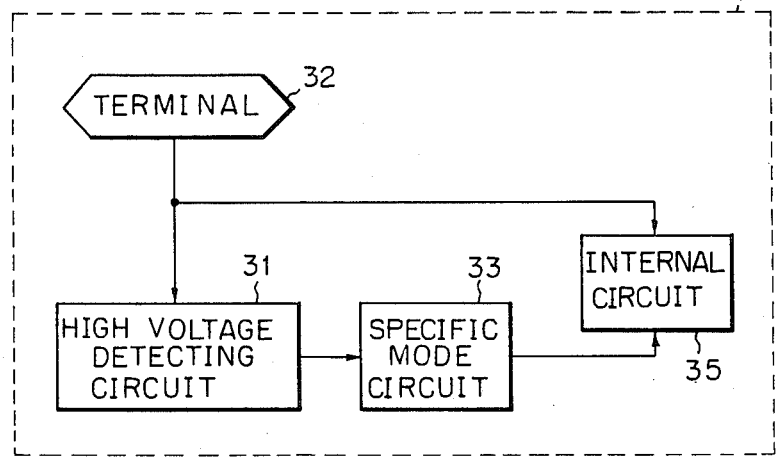
FIG. 1 is a block diagram illustrating a semiconductor device including a high voltage detecting circuit.

FIG. 1 is a block diagram illustrating a semiconductor device including a high voltage detecting circuit. As shown in FIG. 1, a terminal 32 of a semiconductor device 30 is connected to an internal circuit 35 and a signal of the terminal 32 is transmitted directly to the internal circuit 35. The terminal 32 is also connected to a high voltage detecting circuit 31. When a potential of a specific mode signal higher by a predetermined value than a normal input voltage having a predetermined range is applied to the terminal 32 of the semiconductor device 30, the high voltage detecting circuit 31 generates a control signal. The control signal is transmitted to a specific mode circuit 33, and the specific mode circuit 33 switches the internal circuit 35, to a specific mode. That is, when the specific mode signal is applied to the terminal 32 of the semiconductor device 30, the semiconductor device 30 changes to the specific mode, e.g., a testing mode.

Figure 2:
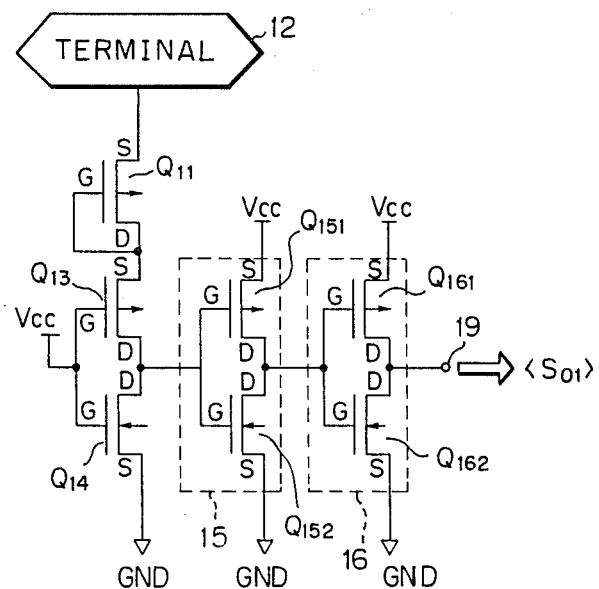
FIG. 2 is a circuit diagram of an example of a conventional high voltage detecting circuit.

FIG. 2 is a circuit diagram of an example of a conventional high voltage detecting circuit. The high voltage detecting circuit is included in a semiconductor device as in the above description with reference to FIG. 1. When a specific mode signal, e.g., 8 volts, higher by a predetermined value than a normal input voltage having a predetermined range, e.g., from 0 volt to 5 volts, is applied to a terminal 12 of the semiconductor device, the high voltage detecting circuit generates a control signal $S_{01}$ for starting a specific mode of the semiconductor device.

A source of a leakage current cutting off transistor $Q_{11}$, which is a P-channel type MIS transistor, is connected to the terminal 12 of the semiconductor device, and a gate and drain of the transistor $Q_{11}$ are connected commonly to a source of a P type MIS transistor $Q_{13}$. A gate and a drain of the transistor $Q_{13}$ are connected to a gate and a drain of an N-channel type MIS transistor $Q_{14}$, respectively, and a source of the transistor $Q_{14}$ is connected to a ground GND. A common gate of both transistors $Q_{13}$ and $Q_{14}$ is connected to a power line Vcc (the reference mark Vcc also indicates a power line potential). A common drain of both transistors $Q_{13}$ and $Q_{14}$ is connected to a common gate of a first inverter circuit 15 consisting of a P type MIS transistor $Q_{151}$ and an N type MIS transistor $Q_{152}$. A common drain of the first inverter circuit 15 is connected to a common gate of a second inverter circuit 16 consisting of a P type MIS transistor $Q_{161}$ and an N type MIS transistor $Q_{162}$. A common drain of the second inverter circuit 16 is an output end 19 of the high voltage detecting circuit and the control signal $S_{01}$ is transmitted from the output end 19 to the internal circuit through the specific mode circuit of the semiconductor device. In the above description, sources of the transistor $Q_{151}$ and $Q_{161}$ are connected to the power line Vcc and sources of the transistor $Q_{152}$ and $Q_{162}$ are connected to the ground GND.

In the above high voltage detecting circuit, when the power line potential Vcc is stabilized, e.g., 5 volts, and a normal mode signal within the normal input voltage, e.g., from 0 volt to 5 volts, is applied to the terminal 12, the high voltage detecting circuit does not generate the control signal. Because a potential of the source of the transistor $Q_{13}$ is not higher by the threshold voltage of the transistor $Q_{13}$ than a potential of the gate of the transistor $Q_{13}$, the transistor $Q_{13}$ is not switched ON. Consequently, a potential of the common gate of the first inverter circuit 15 is at a low level, a potential of the common gate of the second inverter circuit 16 is at a high level, and the output end 19 of the high voltage detecting circuit is at the low level. That is, the control signal $S_{01}$ is not generated and the semiconductor device continues in a normal mode operation.

When the power line potential Vcc is stabilized, e.g., 5 volts, and the specific mode signal, e.g., 8 volts, higher by a predetermined value than the normal input voltage is applied to the terminal 12, the high voltage detecting circuit generates the control signal. Because a potential of the source of the transistor $Q_{13}$ is higher by the threshold voltage of the transistor $Q_{13}$ than a potential of the gate of the transistor $Q_{13}$, the transistor $Q_{13}$ is switched ON. Consequently, a potential of the common gate of the first inverter circuit 15 is at the high level, a potential of the common gate of the second inverter circuit 16 is at the low level, and the output end 19 of the high voltage detecting circuit is at the high level. That is, the staring signal $S_{01}$ is generated and the semiconductor device changes to the specific mode operation.

Figure 3:
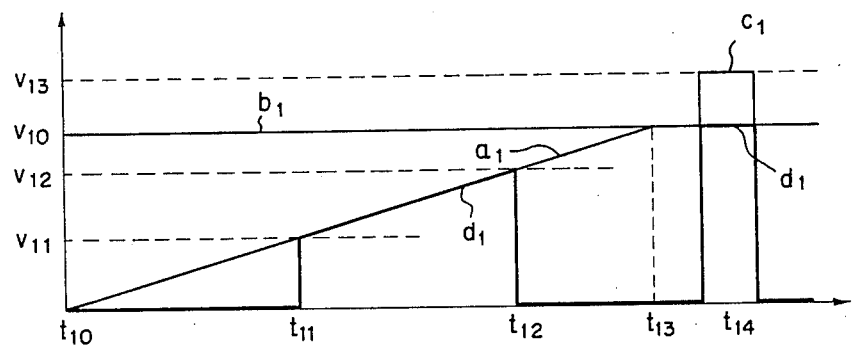
FIG. 3 is a graph illustrating the conventional high voltage detecting circuit shown in FIG. 2 at the time switching ON the semiconductor device.

FIG. 3 is a graph illustrating the conventional high voltage detecting circuit shown in FIG. 2 at the time of switching ON the semiconductor device.

In FIG. 3, when the power line potential Vcc is stabilized at a time $t_{14}$ in FIG. 3 of a potential $V_{10}$ (e.g., 5 volts), and the specific mode signal, shown by a line $c_1$ in FIG. 3, of a potential $V_{13}$ (e.g., 8 volts) higher by the predetermined value than the normal input voltage under a potential $V_{10}$, is applied to the terminal 12 of the semiconductor device, the high voltage detecting circuit generates the control signal $S_{01}$.

When the semiconductor device including the high voltage detecting circuit is switched ON at a time $t_{10}$, the power line potential Vcc is gradually increased from 0 volt at the time $t_{10}$ to the stabilized power line potential $V_{10}$ (e.g., 5 volts) at a time $t_{13}$, shown by a line $a_1$ in FIG. 3, until the power line potential Vcc is stabilized. At the same time, the normal mode signal of the normal input voltage (e.g., under 5 volts) is continuously applied to the terminal of the semiconductor device, shown by a line $b_1$ in FIG. 3, and the high voltage detecting circuit may generate an error control signal for starting the specific mode of the semiconductor device, because when the semiconductor device is switched ON and the power line potential Vcc of the device is gradually increased, the normal mode signal of the normal input voltage is considered to be the starting signal higher by the predetermined value than the increased power line potential $a_1$ below a potential $V_{12}$ at a time $t_{12}$. In FIG. 3, a potential $V_{11}$ at a time $t_{11}$ is an operational potential of the device, that is, the potential $V_{11}$ is an operational potential of the inverter circuit of the device. Therefore, the high voltage detecting circuit may generate the error control signal from the time $t_{11}$ to the time $t_{12}$, when the semiconductor device is switched ON and a power line potential of the device is gradually increased, while the potential of the terminal of the semiconductor device is within a normal input voltage having a predetermined range.

Next, problems of semiconductor circuits using the above prior high voltage detecting circuit will be described with reference to FIGS. 4, 5, and 6.

FIG. 4 is a block circuit diagram illustrating a latch circuit to which a high voltage detecting circuit is applied. In FIG. 4, the latch circuit is included in a semiconductor device (not shown), e.g., semiconductor memory device. The latch circuit is useful for setting the semiconductor device to a specific mode continuously, without a specific mode signal being continuously applied to a terminal $2a$. A signal of the terminal $2a$ is transmitted to the internal circuit directly, as shown by reference marks $D_1$. Signals of the terminals $2b$ and $2c$ are transmitted to the internal circuit through the buffers $B_2$ and $B_3$ respectively, as shown by reference marks $D_2$ and $D_4$. That is, the semiconductor device changes to the specific mode and continues the specific mode by one time receipt of the specific signal, and therefore, all terminals $2a$, $2b$ and $2c$ can be used as input terminals at the specific mode. In the case of a normal mode operation of the semiconductor device, an output signal $D_3$ of a NAND gate $NG_5$ can be changed to a low level or a high level in accordance with a signal of the terminal $2c$. On the other hand, in the specific mode operation of the semiconductor device, the output signal $D_3$ of the NAND gate $NG_5$ is fixed at the high level independently of the signal of the terminal $2c$. That is, the semiconductor device is fixed to the specific mode, e.g., a testing mode, by the high level signal $D_3$.

In the above description, the testing mode is for testing the semiconductor device before forwarding the semiconductor device from a production factory.

The prior high voltage detecting circuit may generate an error control signal without receiving the specific mode signal, for example, the semiconductor device is switched ON and the power line potential of the device is gradually increased while the normal mode signal of the normal input voltage is continuously applied to the terminal of the semiconductor device. Consequently, the latch circuit being applied the prior high voltage detecting circuit, may continuously generate the control signal for starting the specific mode of the semiconductor device without the specific signal being continuously applied to a terminal of the semiconductor device.

Figure 5:
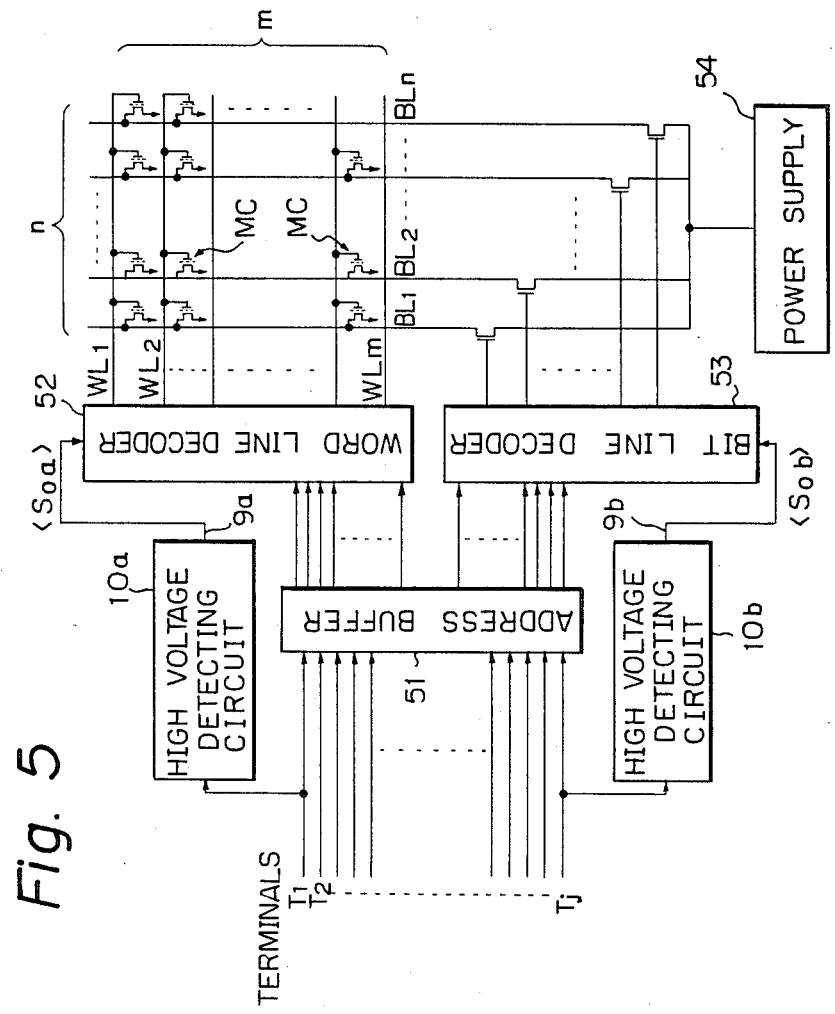
FIG. 5 is a block circuit diagram illustrating an EPROM device to which a high voltage detecting circuit is applied.

FIG. 5 is a block circuit diagram illustrating an EPROM device to which a high voltage detecting circuit is applied. In FIG. 5, the EPROM device has a plurality of terminals $T_1$-$T_j$ being connected to an address buffer 51. The EPROM device has a function of selecting all word liens $WL_1$-$WL_m$ and a function of selecting all bit lines $BL_1$-$BL_n$ for testing all memory cells. The function of selecting all word lines is determined by a first specific mode signal applied to the terminal $T_1$, and the function of selecting all bit lines is determined by a second specific mode signal applied to the terminal $T_j$. Note, the first and second specific mode signals should not be applied to the terminals $T_1$ and $T_j$ at the same time.

However, the prior high voltage detecting circuits $10a$ may generate an error control signal $S_{0a}$ without receiving the first specific mode signal, and at the same time, the prior high voltage detecting circuits $10b$ may generate an error control signal $S_{0b}$ without receiving the second specific mode signal, for example, at the time the EPROM device is switched ON and the power line potential of the EPROM device is gradually increased, while the normal mode signal of the normal input voltage is continuously applied to the terminals $T_1$ and $T_j$ of the EPROM device. When the high voltage detecting circuits $10a$ and $10b$ generate error staring signals $S_{0a}$ and $S_{0a}$ at the same time, all word lines $WL_1$-$WL_m$ are selected and, further, all bit lines $BL_1$-$BL_n$ are selected, and therefore, a certain current (e.g., about 1 $\mu$A) flows in all of the memory cells of the EPROM device. For example, if a memory capacity of the EPROM is 64K bits and the current flowing in each cell is 1 $\mu$A, then the current flowing in the EPROM device is 64 mA, and if a memory capacity of the EPROM is 256K bits and the current flowing in each cell is 1 $\mu$A, then the current flowing the EPROM device is about 260 mA. If such a large current flows in the EPROM device, peripheral circuits, i.e., power supply 54, of the EPROM device cannot supply such large currents. Thus, a power line potential cannot be increased to the normal potential, and the power line potential remains at a certain value under the normal power line potential. When the power line potential remains at a certain value, the normal mode signal of the normal input voltage is continuously considered to be the specific mode signal higher by the predetermined value than the power line potential. Consequently, the flowing of the large current in the EPROM device is continued, until the EPROM device is destroyed.

Figure 6:
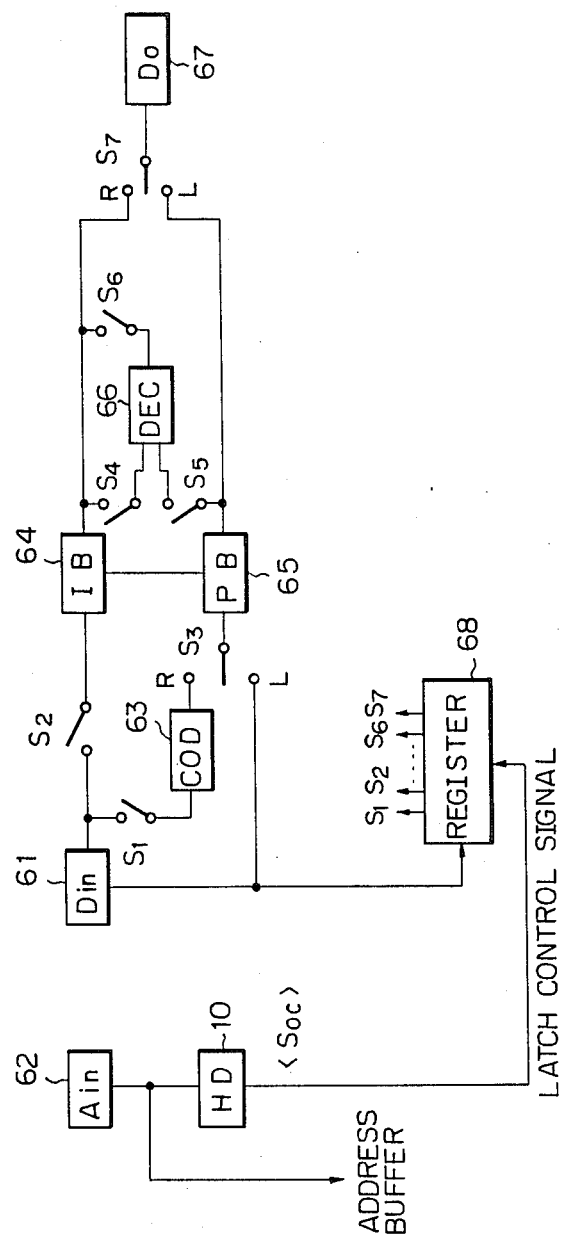
FIG. 6 is a block circuit diagram illustrating a semiconductor memory device having an ECC circuit to which a high voltage detecting circuit is applied.

FIG. 6 is a block diagram illustrating a semiconductor memory device having an error checking and correction (ECC) circuit to which a high voltage detecting circuit is applied. In FIG. 6, the ECC circuit has a switching means $S_1$–$S_7$ and a register 68 for setting signals in order to control the switching of the switching means by a latch control signal. There are three modes in the semiconductor memory device having the ECC circuit in accordance with a state of the register 68, as follows; ① a normal mode for normal operation with correcting error, ② a testing mode for testing information bits, and ③ a testing mode for testing inspection bits. As a result the above three modes, the information bits and the inspection bits can be tested independently without the normal operation mode. The register 68 is controlled by the output signal $S_{0c}$ of the high voltage detecting circuit 10. That is, when the high voltage detecting circuit 10 generates a control signal for the testing mode of the ECC circuit, the ECC circuit changes to the testing mode for testing information bits or the testing mode for testing inspection bits from the normal mode for normal operation with correcting the error.

But the prior high voltage detecting circuits may generate an error control signal without receiving the specific mode signal, when the semiconductor memory device having the ECC circuit is switched ON and the power line potential of the device is gradually increased. Then the ECC circuit may change to the testing mode for testing information bits or the testing mode for testing inspection bits form the normal mode for normal operation with correcting the error, by the error control signal.

Figure 9:
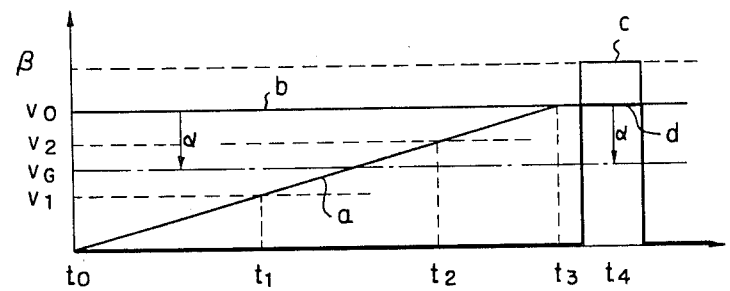
FIG. 9 is a graph illustrating the high voltage detecting circuit shown in FIG. 8 at the time of switching ON the semiconductor device.
Figure 7:
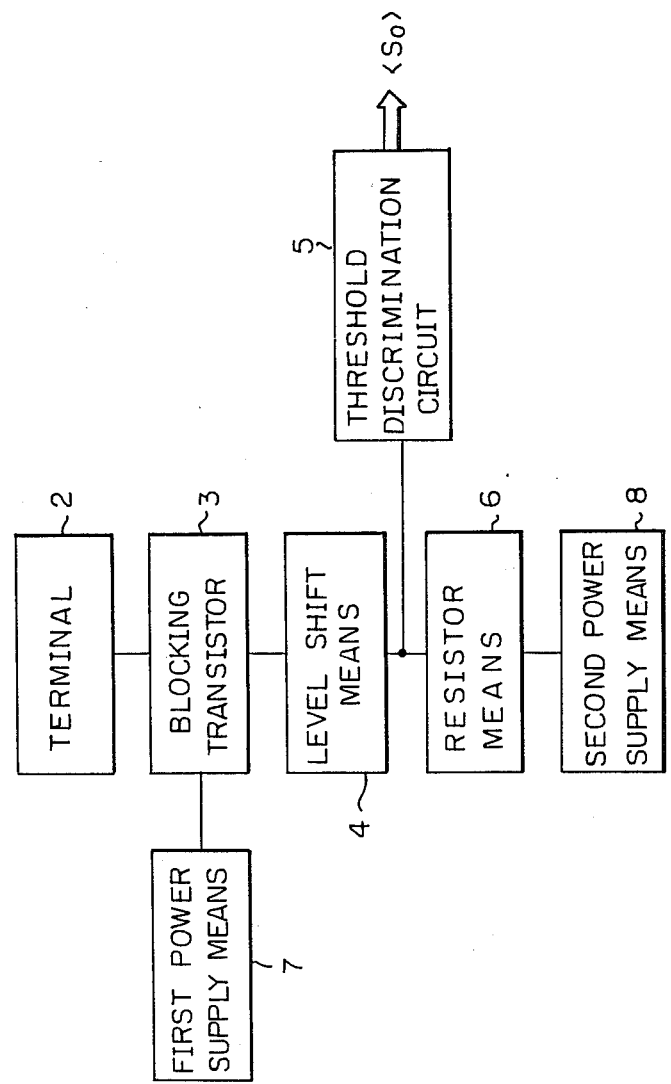
FIG. 7 is a block diagram illustrating a high voltage detecting circuit explaining a general concept of the present invention.
Figure 8:
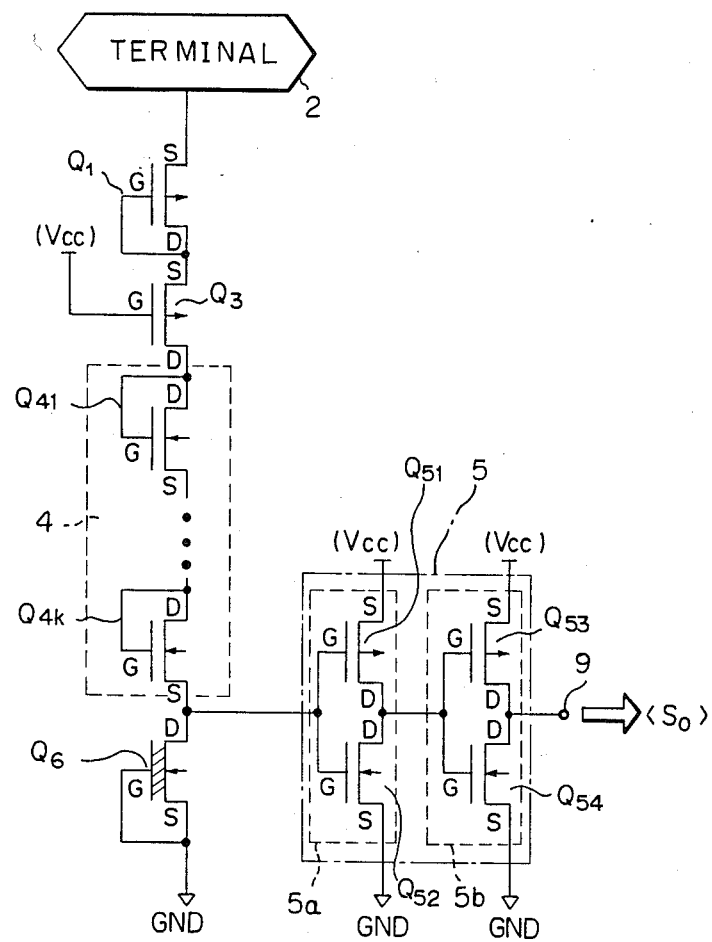
FIG. 8 is a circuit diagram of a preferred embodiment of a high voltage detecting circuit according to the present invention.

Referring to FIGS. 7, 8 and 9, the preferred embodiments according to the present invention will be described.

FIG. 7 is a block diagram illustrating a high voltage detecting circuit explaining a general concept of the present invention.

As shown in FIG. 7, a high voltage detecting circuit of the present invention is included in a semiconductor device having terminals 2, for generating a control signal $S_0$ in order to start a specific mode of the semiconductor device when a potential of a specific mode signal higher by a predetermined value than a normal input voltage having a predetermined range is applied to at least one of the terminals 2 of the semiconductor device.

The high voltage detecting circuit includes a first power supply means 7, a second power supply means 8, a blocking transistor 3, a level shift means 4, a resistor means 6, and a discrimination circuit 5. The first power supply means 7 is used for a high potential and the second power supply means 8 is used for a low potential. The blocking transistor 3 has a control electrode and two other electrodes, the control electrode being operatively connected to at least one of the terminals 2 of the semiconductor device and one of the two other electrodes being operatively connected to the first power supply means 7, for switching ON the blocking transistor 3 when a potential of the control electrode is higher than a potential of the one of the two other electrodes by a threshold voltage of the blocking transistor 3.

The level shift means 4 has an input end and an output end, the input end being operatively connected to the other of the two other electrodes of the blocking transistor 3 for obtaining a potential of the output end lower by a level shift value than a potential of the input end. The resistor means 6 has a first end and a second end, the first end being operatively connected to the output end of the level shift means 4, and the second end being operatively connected to the second power supply means 8, for keeping the potential of the first end to the low potential of the second power supply means 8 when a potential of at least one of the terminals 2 of the semiconductor device is within the predetermined range of the normal input voltage. The discrimination circuit 5 has a first end and a second end, the first end of the discrimination circuit 5 being operatively connected to the output end of the level shift means 4 and to the first end of the resistor means 6, for outputting the control signal $S_0$ to the second end of the discrimination circuit 5, when a potential of the first end of the discrimination circuit 5 is higher than a threshold voltage of the discrimination circuit 5.

FIG. 8 is a circuit diagram of a preferred embodiment of a high voltage detecting circuit according to the present invention. The high voltage detecting circuit is included in the semiconductor device as in the above description. When a specific mode signal, e.g., 8 volts, higher by a predetermined value than a normal input voltage having a predetermined range, e.g., from 0 volt to 5 volts, is applied to the terminal 2 of the semiconductor device, the high voltage detecting circuit generates a control signal $S_0$ for starting a specific mode of the semiconductor device.

A source of leakage current cutting off transistor $Q_1$, which is a P type MIS transistor, is connected to a terminal 2 of the semiconductor device. A gate and a drain of the transistor $Q_1$ are connected commonly to a source of a blocking transistor $Q_3$, which is a P type MIS transistor. The leakage current cutting off transistor $Q_1$ is for keeping a leakage current under a predetermined standard current of the semiconductor device. Therefore, a potential of the source of the transistor $Q_3$ is lower by the threshold voltage of the transistor $Q_1$ than a potential of the terminal 2.

A gate of the blocking transistor $Q_3$ is connected to a power line Vcc and a drain of the transistor $Q_3$ connected to an input end of a level shift circuit 4. When a potential of the gate of the transistor $Q_3$ is higher by the threshold voltage of the blocking transistor $Q_3$ than a potential of the source of the transistor $Q_3$, the blocking transistor $Q_3$ is switched OFF.

The level shift circuit 4 includes k pieces of MIS transistors $Q_{41}, \ldots, Q_{4k}$. In a first transistor $Q_{41}$ of the level shift circuit 4, a gate and a drain of the transistor $Q_{41}$ is commonly connected to the drain of the blocking transistor $Q_3$ as the input end of the level shift circuit 4. A source of the first transistor $Q_{41}$ is connected to a gate and a drain of a second transistor of the level shift circuit 4, and a source of the second transistor is connected to a gate and a drain of a third transistor of the level shift circuit 4 as same as the first transistor $Q_{41}$. A source of a final transistor $Q_{4k}$ is connected as the input end of the level shift circuit 4 to a drain of a resistor transistor $Q_6$ and to a first end of a discrimination circuit 5. The level shift circuit 4 is used for obtaining a potential of the output end lower by a level shift value than a potential of the input end. The level shift value is determined by a sum of the threshold voltage of the k pieces of MIS transistors $Q_{41}, \ldots, Q_{4k}$ in the level shift circuit 4.

The discrimination circuit 5 includes a first inverter circuit 5a and a second inverter circuit 5b, the first inverter circuit 5a consists of a P type MIS transistor $Q_{51}$ and an N type MIS transistor $Q_{52}$, and the second inverter circuit 5b consists of a P type MIS transistor $Q_{53}$ and an N type MIS transistor $Q_{54}$. The first end of a discrimination circuit 5, which is a common gate of a first inverter circuit 5a, is connected to the output end of the level shift circuit 4 and to the drain of a resistor transistor $Q_6$. The discrimination circuit 5 is for outputting the control signal $S_0$ in order to start the specific mode of the semiconductor device to a second end of the discrimination circuit 5, which is a common drain of the inverter circuit 5b. That is, the discrimination circuit 5 generates the control signal $S_0$, when a potential of the common gate of the first inverter circuit 5a is higher than the threshold voltage of the first inverter circuit 5a. In the above description, the second inverter circuit 5b is for completing and inverting the output signal of the first inverter circuit 5a, sources of the transistor $Q_{51}$ and $Q_{53}$ are connected to the power line Vcc, and source of the transistor $Q_{52}$ and $Q_{54}$ are connected to the ground GND.

The resistor $Q_6$ is a depletion type MIS transistor, and a gate and a source of the transistor $Q_6$ is commonly connected to the ground GND. The resistor transistor $Q_6$ is for keeping the potential of the drain of the transistor $Q_6$ to the low potential of the ground GND, when a potential of the terminal 2 of the semiconductor device is within the predetermined range of the normal input voltage. That is, the resistor transistor $Q_6$ flows an unnecessary electrical charge at the input end of the discrimination circuit 5 to the ground GND, when the potential of the input end changes from the high level to the low level.

Referring to FIG. 8, the operation of the high voltage detecting circuit will be described when the power line potential Vcc of the semiconductor device is stabilized, e.g., 5 volts.

First, the normal mode operation of the semiconductor device will be described. When the semiconductor device including the high voltage detecting circuit is used in the normal mode operation, the normal mode signal within the predetermined range of the normal input voltage, (e.g., 0–5 volts, which is not higher than the power line potential Vcc of 5 volts supplied by another device, is applied to the terminal 2 of the semiconductor device. The potential of the input signal of the terminal 2 is dropped to the threshold voltage of the transistor $Q_1$ by cutting off the leakage current to transistor $Q_1$ and applying it to the source of the blocking transistor $Q_3$.

Therefore, the blocking transistor $Q_3$ is switched OFF, since the transistor $Q_3$ is switched ON only when the potential of the source of the transistor $Q_3$ is higher by the threshold voltage of the transistor $Q_3$, than the potential of the gate of the transistor $Q_3$ which is power line potential Vcc. Therefore, the input end of the level shift circuit 4 is at the low level and the common gate of the first inverter circuit 5a is also at the low level, and thus the common drain of the second inverter circuit 5b is at the low level. That is, when the power line potential Vcc is stabilized while the normal mode signal is applied to the terminal 2, the high voltage detecting circuit will not generate the control signal $S_0$ for starting the specific mode of the semiconductor device.

Next, the specific mode operation of the semiconductor device will be described. When the semiconductor device including the high voltage detecting circuit is used as the specific mode operation, e.g., testing mode operation. That is, the specific mode signal, e.g., 8 volts, higher by the predetermined value than the normal input voltage, is applied to the terminal 2 of the semiconductor device. The potential of the source of the transistor $Q_3$ is higher by the threshold voltage of the transistor $Q_3$ than the potential of the gate of the transistor $Q_3$, but the potential of the input signal of the terminal 2 is dropped to the threshold voltage of the transistor $Q_1$ by cutting off the leakage current at the transistor $Q_1$ and applying it to the source of the blocking transistor $Q_3$.

Consequently, the blocking transistor $Q_3$ is switched ON and the input end of the level shift circuit 4 is at the high level. Although the potential of the input end of the level shift circuit 4 is dropped to the sum of the threshold voltages of k pieces of MIS transistors $Q_{41}, \ldots, Q_{4k}$ in the level shift circuit 4 by the transistors $Q_{41}, \ldots, Q_{4k}$, which is the threshold voltage of the level shift circuit 4, the output end of the level shift circuit 4 is still at the high level. That is, the potential of the output of the level shift circuit 4 is higher than the threshold voltage of the first inverter circuit 5a, and the potential of the specific mode signal is determined by the threshold voltages of the transistors $Q_1$ and $Q_3$, the level shift circuit 4, and the first inverter circuit 5a. Therefore, the common gate of the first inverter circuit 5a is at the high level, and thus the common drain of the second inverter circuit is at the high level. That is, when the power line potential Vcc is stabilized and the specific mode signal is applied to the terminal 2, the high voltage detecting circuit generates the control signal $S_0$ for starting the specific mode of the semiconductor device.

Referring to FIG. 9, the operation of the high voltage detecting circuit will be described when the power line potential Vcc of the semiconductor device is not stabilized, e.g., when the semiconductor device is switched ON.

FIG. 9 is a graph illustrating the high voltage detecting circuit shown in FIG. 8 at the time of switching ON the semiconductor device.

When the semiconductor device including the high voltage detecting circuit is switched ON at a time $t_0$, the power line potential Vcc is gradually increased from the time $t_0$ to a time $t_3$ until the power line potential is stabilized, shown by a line a in FIG. 9. When the normal mode signal of the normal input voltage is continuously applied to the terminal of the semiconductor device, shown by a line b in FIG. 9, and at the same time the semiconductor device is switched ON, the normal mode signal having the potential of the line b is considered to be the specific mode signal. Because the potential of the source of the blocking transistor $Q_3$ (which has the potential lower by the threshold voltage of the transistor $Q_1$ than the potential of the normal mode signal) is higher (by the threshold voltage of the transistor $Q_3$ than the potential of the gate of the transistor $Q_3$), which is the increasing power line potential of the line a, the blocking transistor $Q_3$ is switched ON from the time $t_0$ to a time $t_2$, that is, the blocking transistor $Q_3$ is switched ON until the time that the normal mode signal is not considered to be the specific mode signal.

However, when the potential of the output end of the level shift circuit is at the low level, the blocking transistor $Q_3$ is switched ON. Note, the inverter circuits 5a and 5b cannot be operated until the power line potential exceeds an operable voltage $V_1$ of the inverter circuits. Consequently, it is possible to generate an error control signal for starting the specific mode of the semiconductor device from a time $t_1$ to the time $t_2$ in the high voltage detecting circuit. But in the high voltage detecting circuit shown in FIG. 8, the potential of the drain of the blocking transistor is dropped the predetermined value by the level shift circuit 4, and the potential of the common gate of the first inverter circuit 5a is not higher than the threshold voltage of the inverter circuit 5a (i.e., the threshold voltage of the transistor $Q_{51}$ of the first inverter circuit 5a). Consequently, the error control signal for starting the specific mode of the semiconductor device is not generated, even if the potential of the source of the blocking transistor $Q_3$ is higher by the threshold voltages of the transistor $Q_3$ than the increasing power line potential. Note, the predetermined voltage value of the level shift circuit 4 is indicated by a reference mark $\alpha$, the threshold voltages of the transistors $Q_1$ and $Q_3$ are indicated by reference marks $Vth_1$ and $Vth_3$ respectively, the threshold voltage of the transistor $Q_{51}$ of the first inverter circuit 5a is indicated by a reference mark $Vth_{51}$, the increasing power line voltage is indicated by a reference mark $V_X$, the potential of the input end of the first inverter circuit 5a is indicated by a reference mark $V_G$, and the potential of the normal input signal is indicated by a reference mark $V_0$.

The potential of the normal input signal applied to the terminal 2 is $V_0$, e.g., 5 volts, and the potential $V_G$ is indicated by the following formula.

$$V_G = V_0 - Vth_1 - Vth_3 - \alpha \tag{A}$$

Furthermore, a condition in which the discrimination circuit 5 does not generate the control signal $S_0$ for starting the specific mode of the semiconductor device, is the potential $V_X$ being applied to the source of blocking transistor $Q_3$ is higher by the threshold voltage $Vth_{51}$ of the transistor $Q_{51}$ than the potential $V_G$ being applied to the gate of blocking transistor $Q_3$. Therefore, the potential $V_G$ is indicated by the following formula.

$$V_G \leq V_X - Vth_{51} \tag{B}$$

From the above two formulas (A) and (B), the predetermined voltage value $\alpha$ is indicated by the following formula.

$$\alpha \geq V_0 - V_X + Vth_{51} - Vth_1 - Vth_3 \tag{C}$$

In the increasing power line voltage $V_X$, the possibility of generating the error control signal is in a range of $V_l \leq V_X \leq V_x$, and the predetermined voltage value $\alpha$ is indicated by the following formula.

$$\alpha \geq V_0 - V_1 + Vth_{51} - Vth_1 - Vth_3 \tag{D}$$

It is necessary that the predetermined voltage value $\alpha$, dropped by the level shift circuit 4, be determined as satisfying the above formula (D). When the value $\alpha$ is determined by the formula (D), the potential of the output of the level shift circuit 4 is not higher than the threshold voltage of the first inverter circuit 5a, even when the semiconductor device is switched ON while the normal mode signal of the normal input voltage is continuously applied to the terminal of the semiconductor device. That is, the potential $V_G$ of the input end of the first inverter circuit 5a is not higher than the threshold voltage $Vth_{51}$ of the transistor $Q_{51}$ in the first inverter circuit 5a, the P type MIS transistor $Q_{51}$ is switched ON and the transistor $Q_{52}$ is switched OFF. Therefore, the potential of the output end of the first inverter 5a is at the high level and the potential of the output end of the second inverter 5b is at the low level, that is the control signal $S_0$ is not generated.

Next, the potential $\beta$ of the specific mode signal applied to the terminal of the semiconductor device will be described, as shown by reference mark c in FIG. 9. The potential $V_G$ of the input end of the first inverter circuit 5a should be at the high level, e.g., the potential $V_0$ of the normal input signal, when the potential $\beta$ of the specific mode signal is applied to the terminal of the semiconductor device. The normal input signal $V_0$ is equal to the power line potential Vcc when the semiconductor device is stabilized, and therefore, the potential $V_G$ of the input end of the first inverter circuit 5a is indicated by the following formula.

$$V_G = \beta - Vth_1 - Vth_3 - \alpha \tag{$A_0$}$$

$$V_G \geq V_0 - Vth_{51} \tag{$B_0$}$$

From the above two formulas ($A_0$) and ($B_0$), the potential $\beta$ the specific mode signal is indicated by the following formula.

$$\beta \geq V_0 + \alpha + Vth_1 + Vth_3 - Vth_{51} \tag{$C_0$}$$

It is obvious that the potential $\beta$ of the specific mode signal should be determined in accordance with the voltage value of $\alpha$ dropped by the level shift circuit 4 as shown in the formula ($C_0$). That is, if the predetermined voltage value $\alpha$ is established as the higher value, the potential $\beta$ should be determined as the higher value. Consequently, the predetermined voltage value $\alpha$ should not be established as the higher value unless absolutely necessary.

Next, applications of semiconductor circuits using the embodiment of the high voltage detecting circuit according to the present invention will be described with reference to FIGS. 4, 5, and 6.

FIG. 4 is a block circuit diagram illustrating a latch circuit to which a high voltage detecting circuit is applied. In FIG. 4, the latch circuit, included in a certain semiconductor device (not shown), e.g., semiconductor memory device, has three terminals 2a, 2b, and 2c, a logic circuit 40, and a high voltage detecting circuit 10. The terminal 2a is connected to an internal circuit of the semiconductor device, and the terminal 2a is also connected to a high voltage detecting circuit 10. The terminal 2b is connected through a buffer $B_1$ to the logic circuit 40 and through a buffer $B_2$ to the internal circuit of the semiconductor device. The terminal 2c is connected through a buffer $B_3$ to the logic circuit 40 and to the internal circuit of the semiconductor device.

In a normal mode operation of the semiconductor device, a signal of the terminal 2a is transmitted to the internal circuit directly, as shown by reference marks $D_1$, and signals of the terminal 2b and 2c are transmitted to the internal circuit through the buffer $B_2$ and $B_3$ respectively, as shown by reference marks $D_2$ and $D_4$. In the above description, each potential of the signal $D_1$, $D_2$, and $D_4$ is within a normal input voltage and a power line potential is stabilized. In normal operation mode, the high voltage detecting circuit 10 does not generate a control signal $S_0$, that is, an output signal of the high voltage detecting circuit 10 is at a low level.

When a specific mode signal higher by a predetermined value than the normal input voltage is applied to the terminal 2a while the power line potential is stabilized, a control signal $S_0$ for starting a specific mode of the semiconductor device is generated from the high voltage detecting circuit 10. While the control signal, which is at a high level, is generated from the high voltage detecting circuit 10, at the same time, a high level signal within a normal input voltage is applied to the terminal 2b, an output signal of an NAND gate $NG_2$ is at the low level and an output signal of an NAND gate $NG_1$ is at the high level. Therefore, an output signal of an NAND gate $NG_4$ is at the high level and an output signal of an NAND gate $NG_3$ is at the low level. That is, in the specific mode operation, the output signal of the NAND gate $NG_3$ is at the low level. Therefore, an output signal of an NAND gate $NG_5$ is at the high level as shown by a reference mark $D_3$ and the output signal of the NAND gate $NG_5$ which is at the high level is applied to the internal circuit. In the above description, the output signal $D_3$ of the NAND gate $NG_5$ is continuously at the high level without applying a specific mode signal to the terminal 2a. When the internal circuit received the low level signal $D_3$ of the output of the NAND gate $NG_5$, the semiconductor device including the internal circuit changes to a certain specific mode, for example, a testing mode for testing the semiconductor device.

FIG. 5 is a block circuit diagram illustrating an EPROM device to which a high voltage detecting circuit is applied. In FIG. 5, the EPROM device has a function of selecting all word lines $WL_1$-$WL_m$ and a function of selecting all bit lines $BL_1$-$BL_n$ for testing all memory cells. The EPROM device has a plurality of terminals $T_1$-$T_j$ connected to an address buffer 51. The terminal $T_1$ of the terminals $T_1$-$T_j$ are connected to a high voltage detecting circuit 10a and an output 9a of the high voltage detecting circuit 10a is applied to a word line decoder 52. The terminal $T_j$ of the terminals $T_1$-$T_j$ is connected to a high voltage detecting circuit 10b and an output 9b of the high voltage detecting circuit 10b is applied to a bit line decoder 53. The word line decoder 52 has a plurality of word lines $WL_1$-$WL_m$, the bit line decoder 53 many bit lines $BL_1$-$BL_n$, and there are a plurality of memory cells MC at each cross point of the word lines $WL_1$-$WL_m$ and the bit lines $BL_1$-$BL_n$. In the above description, the function of selecting all word lines and the function of selecting all bit lines are used to give stress to the memory cells, and thereby test them. The function of selecting all word lines is determined by a first specific mode signal applied to the terminal $T_1$, and the function of selecting all bit lines is determined by a second specific mode signal applied to the terminal $T_j$. Note, the first and second specific mode signals should not be applied to the terminals $T_1$ and $T_j$, at the same time. In FIG. 5, reference numeral 54 denotes a power supply.

In a normal mode operation of the EPROM device, a signal of each terminal $T_1$-$T_j$ is transmitted to the word line decoder 52 and the bit line decoder 53 through the address buffer 51. In the normal mode operation of the EPROM device, normal address signals within a normal input voltage are applied to the terminals $T_1$-$T_j$, and the high voltage detecting circuits 10a and 10b do not generate starting signals $S_{0a}$ and $S_{0b}$, respectively. In the specific mode operation of the EPROM device, the first specific signal or the second specific signal is applied to the terminals $T_1$ or $T_j$, and then one of the high voltage detecting circuits 10a and 10b generates a control signal $S_{0a}$ or $S_{0b}$. In this case, the high voltage detecting circuits 10a and 10b should not generate a control signal at the same time.

FIG. 6 is a block circuit diagram illustrating a semiconductor memory device having an error checking and correction (ECC) circuit to which a high voltage detecting circuit is applied. In FIG. 6, the ECC circuit has a switching means $S_1$-$S_7$ and a register 68 for setting signals in order to control the switching of the switching means by a latch control signal. There are three modes in the semiconductor memory device in accordance with a state of the register 68, as follows; ① a normal mode for normal operation with correcting the error, ② a testing mode for testing information bits, and ③ a testing mode for testing inspection bits. As a result of the above three modes, the information bits and the inspection bits can be inspected independently without the normal operation mode. In FIG. 6, reference normal 10 denotes a high voltage detecting circuit (HD), reference numeral 61 denotes data input (Din), reference numeral 62 denotes a plurality of address input (Ain), a reference numeral 63 denotes a encorder (COD), reference numeral 64 denotes information bits (IB), reference numeral 65 denotes inspection bits (PB), reference numeral 66 denotes a decoder (DEC), reference numeral 67 denotes an error checking and correction circuit having data output (Do), and reference numeral 68 denotes a register.

In ①, the normal mode for normal operation with correcting the error, the switching means are as follows: $S_1$=ON, $S_2$=ON, $S_3$=R, $S_4$=ON, $S_5$=ON, $S_6$=ON, $S_7$=R, and therefore, the ECC circuit is operated and corrected data is output. In ②, the testing mode for testing information bits, the switching means are as follows: $S_1$=OFF, $S_2$=ON, $S_3$=R, $S_4$=OFF, $S_5$=OFF, $S_6$=OFF, $S_7$=R, and therefore, the ECC circuit is not operated and the information bits can be tested. In ③, the testing mode for testing inspection bits, the switching means are as follows: $S_1$=OFF, $S_2$=OFF, $S_3$=L, $S_4$=OFF, $S_5$=OFF, $S_6$=OFF, $S_7$=L, and therefore, the ECC circuit is not operated and the inspection bits can be tested. In FIG. 6, the switching of the switching means is controlled by the register 68, which is provided with predetermined information of the switching state of the above three modes.

In the above description referring to FIGS. 4, 5, and 6, the semiconductor circuits using the embodiments of the high voltage detecting circuit according to the present invention are not started in testing mode by the error control signal for starting the testing mode of the semiconductor circuit generated from the high voltage detecting circuit.

Many widely different embodiments of the present invention may be constructed without departing from the spirit and scope of the present invention. It should be understood that the present invention is not limited to the specific embodiments described in this specification, except as defined in the appended claims.

We claim:

1. A high voltage detecting circuit included in a semiconductor device having a normal mode and a specific mode, comprising:

input terminal means for receiving an input signal having a normal input voltage being within a predetermined range and for receiving a specific mode signal having a voltage higher than said normal input voltage;

first power supply means for supplying a high potential to said semiconductor device;

second power supply means for supplying a low potential to said semiconductor device;

blocking transistor means, having a control electrode and first and second electrodes, said first electrode being operatively connected to said input terminal means and said control electrode being operatively connected to said first power supply means, said blocking transistor means being turned ON when a potential of said first electrode is higher by a threshold voltage of said blocking transistor means than a potential of said control electrode;

level shift means having an input and an output, said input being operatively connected to said second electrode of said blocking transistor means, for obtaining at said output of said level shift means, a potential lower, by a level shift value, than a potential of said input, said level shift means comprising at least one MIS transistor having a gate electrode, a source electrode, and a drain electrode, said gate and drain electrodes of said at least one MIS transistor being operatively connected to said input of said level shift means and said source electrode being operatively connected to said first end of said resistance means, said level shift value being determined by the threshold voltage of said at least one MIS transistor;

resistance means, having a first end operatively to said output of said level shift means and a second end operatively connected to said second power supply means, for keeping the potential of the output of said level shift means at the low potential of said second power supply means when a potential of said input terminal means is within said predetermined range of said normal input voltage; and discrimination means, having a first end operatively connected to said output of said level shift means and to said first end of said resistance means, for outputting a control signal when a potential of the output of said level shift means is higher than a threshold voltage of said discrimination means, so as to switch said semiconductor device from said normal mode to said specific mode.

2. A high voltage detecting circuit included in a semiconductor device having a normal mode and a specific mode, comprising:

input terminal means for receiving an input signal having a normal input voltage being within a predetermined range and for receiving a specific mode signal having a voltage higher than said normal input voltage;

first power supply means for supplying a high potential to said semiconductor device;

second power supply means for supplying a low potential to said semiconductor device;

blocking transistor means, having a control electrode and first and second electrodes, said first electrode being operatively connected to said input terminal means and said control electrode being operatively connected to said first power supply means, said blocking transistor means being turned ON when a potential of said first electrode is higher by a threshold voltage of said blocking transistor means than a potential of said control electrode;

level shift means having an input and an output, said input being operatively connected to said second electrode of said blocking transistor means, for obtaining at said output of said level shift means, a potential lower, by a level shift value, than a potential of said input;

resistance means, having a first end operatively connected to said output of said level shift means and a second end operatively connected to said second power supply means, for keeping the potential of the output of said level shift means at the low potential of said second power supply means when a potential of said input terminal means is within said predetermined range of said normal input voltage, said resistance means comprising a depletion type MIS transistor having a gate electrode, a source electrode, an a drain electrode, said gate electrode of said depletion type MIS transistor being connected to said source electrode of said depletion type MIS transistor and to said second power supply means, and said drain electrode of said depletion type MIS transistor being operatively connected to said output of said level shift means; and discrimination means, having a first end operatively connected to said output of said level shift means and to said first end of said resistance means, for outputting a control signal when a potential of the output of said level shift means is higher than a threshold voltage of said discrimination means so as to switch said semiconductor device from said normal mode to said specific mode.

3. A high voltage detecting circuit included in a semiconductor device having a normal mode and a specific mode, comprising:

input terminal means for receiving an input signal having a normal input voltage being within a predetermined range and for receiving a specific mode signal having a voltage higher than said normal input voltage;

first power supply means for supplying a high potential to said semiconductor device;

second power supply means for supplying a low potential to said semiconductor device;

blocking transistor means, having a control electrode and first and second electrodes, said first electrode being operatively connected to said input terminal means and said control electrode being operatively connected to said first power supply means, said blocking transistor means being turned ON when a potential of said first electrode is higher by a threshold voltage of said blocking transistor means than a potential of said control electrode;

level shift means having an input and an output, said input being operatively connected to said second electrode of said blocking transistor means, for obtaining at said output of said level shift means, a potential lower, by a level shift value, than a potential of said input;

resistance means having a first end operatively connected to said output of said level shift means and a second end operatively connected to said second power supply means, for keeping the potential of the output of said level shift means at the low potential of said second power supply means when a potential of said input terminal means is within said predetermined range of said normal input voltage;

discrimination means, having a first end operatively connected to said output of said level shift means and to said first end of said resistance means, for outputting a control signal when a potential of the output of said level shift means is higher than a threshold voltage of said discrimination means, so as to switch said semiconductor device from said normal mode to said specific mode; and a leakage current cutting off transistor having a gate electrode, a source electrode, and a drain electrode, said gate electrode of said leakage current cutting off transistor being operatively connected to said drain electrode of said leakage current cutting off transistor and to said source electrode of said blocking transistor means, and said source electrode of said leakage current cutting off transistor being operatively connected to said input terminal means so as to keep a leakage current under a predetermined standard current of said semiconductor device.

* * * * *

UNITED STATES PATENT AND TRADEMARK OFFICE
CERTIFICATE OF CORRECTION

PATENT NO. : 4,812,680

DATED : March 14, 1989

INVENTOR(S) : Kawashima et al.

It is certified that error appears in the above-identified patent and that said Letters Patent is hereby corrected as shown below:

FRONT PAGE [56] References Cited, line 11, "7/1985" should be --12/83--.

[57] ABSTRACT, line 13, "valve" should be --value--; line 14, "detecing" should be --detecting--.

Col. 4, line 66, "staring" should be --control signal--.

Col. 6, line 41, "staring" should be --starting--.

Col. 7, line 7, after "correcting" insert --the--.

Col. 9, line 39, "voltage," should be --voltage--; line 39, "volts," should be --volts),--.

Col. 10, line 41, "a" (second occurrence) should be --$\underline{a}$--;
line 45, "b" should be --$\underline{b}$--;
line 47, "b" should be --$\underline{b}$--;
line 53, "$Q_3$" (first occurrence) should be --$Q_3$)--;
line 53, "$Q_3$)" (second occurrence) should be --$Q_3$,--;
line 55, "a" should be --$\underline{a}$--.

UNITED STATES PATENT AND TRADEMARK OFFICE
CERTIFICATE OF CORRECTION

PATENT NO. : 4,812,680

DATED : March 14, 1989

INVENTOR(S) : Kawashima et al.

It is certified that error appears in the above-identified patent and that said Letters Patent is hereby corrected as shown below:

Col. 12, line 5, "c" should be --$\underline{c}$--.

Col. 14, line 19, "encorder" should be --encoder--.

Col. 15, line 28, after "operatively" insert --connected--;

Col. 16, line 25, "means" should be --means,--.

Signed and Sealed this

Sixteenth Day of January, 1990

*Attest:*

JEFFREY M. SAMUELS

*Attesting Officer*  *Acting Commissioner of Patents and Trademarks*